(12) United States Patent
Bolane et al.

(10) Patent No.: US 12,260,026 B2
(45) Date of Patent: Mar. 25, 2025

(54) USER INTERFACE FOR PUMPS FOR SWIMMING POOLS AND SPAS

(71) Applicant: ZODIAC POOL SYSTEMS LLC, Carlsbad, CA (US)

(72) Inventors: Jesse Bolane, San Marcos, CA (US); Matthew Golman, San Marcos, CA (US); Merinda Nugent, Vista, CA (US); Steven Alan Jones, San Marcos, CA (US); Alec Momont, San Francisco, CA (US); Jeffrey Servaites, Oakland, CA (US); Ryan Starling, San Rafael, CA (US); Kenneth Hsieh, Seattle, WA (US); Paolo Forte, Boston, MA (US)

(73) Assignee: ZODIAC POOL SYSTEMS LLC, Carlsbad, CA (US)

( * ) Notice: Subject to any disclaimer, the term of this patent is extended or adjusted under 35 U.S.C. 154(b) by 197 days.

(21) Appl. No.: 17/679,478

(22) Filed: Feb. 24, 2022

(65) Prior Publication Data
US 2022/0269353 A1    Aug. 25, 2022

Related U.S. Application Data

(60) Provisional application No. 63/153,766, filed on Feb. 25, 2021.

(51) Int. Cl.
| | | |
|---|---|---|
| *G06F 3/02* | (2006.01) | |
| *E04H 4/12* | (2006.01) | |
| *H05K 5/02* | (2006.01) | |

(52) U.S. Cl.
CPC ......... *G06F 3/0202* (2013.01); *E04H 4/1245* (2013.01); *H05K 5/0226* (2013.01)

(58) Field of Classification Search
CPC .... E04H 4/1245; F04B 39/121; F04B 49/065; F04B 19/04; F04B 49/002; F04B 53/16;
(Continued)

(56) References Cited

U.S. PATENT DOCUMENTS

| | | |
|---|---|---|
| 8,043,070 B2 | 10/2011 | Stiles, Jr. et al. |
| 8,465,262 B2 | 6/2013 | Stiles, Jr. et al. |

(Continued)

FOREIGN PATENT DOCUMENTS

| | | |
|---|---|---|
| WO | 2008073436 | 6/2008 |
| WO | 2011106530 | 9/2011 |
| WO | 2016087595 | 6/2016 |

OTHER PUBLICATIONS

International Application No. PCT/US2022/017620, International Search Report and the Written Opinion mailed on Jun. 7, 2022, 13 pages.

(Continued)

*Primary Examiner* — Richard J Hong
(74) *Attorney, Agent, or Firm* — Kilpatrick Townsend & Stockton LLP

(57) ABSTRACT

A user interface may be communicatively coupled with a fluid-moving pump and may include at least two interactive regions for receiving user input to control the fluid-moving pump. The user interface may be attached to the fluid-moving pump using a mounting cover and an attachment bracket that can allow attachment or positioning of the user interface relative to the fluid-moving pump via a turn motion or other suitable methods. In other examples, the user interface can be mounted on a wall or other surface.

12 Claims, 13 Drawing Sheets

(58) Field of Classification Search
CPC .......... F04D 1/00; F04D 13/06; F04D 29/628; F04D 13/0686; F04D 15/0077; G06F 3/0202; H05K 5/0226; H05K 5/02; H04M 1/72403; H04M 1/022; H01M 50/262; H02P 5/747

See application file for complete search history.

(56) References Cited

U.S. PATENT DOCUMENTS

| | | | |
|---|---|---|---|
| 9,051,930 B2 | 6/2015 | Stiles, Jr. et al. | |
| 9,354,636 B2 | 5/2016 | McKinzie | |
| 10,030,647 B2 | 7/2018 | Ortiz et al. | |
| 10,240,604 B2 | 3/2019 | Stiles, Jr. et al. | |
| 10,502,203 B2 | 12/2019 | Stiles, Jr. et al. | |
| 10,527,042 B2 | 1/2020 | Stiles, Jr. et al. | |
| 2001/0049296 A1* | 12/2001 | Lee | H04M 1/72403 455/566 |
| 2007/0154323 A1* | 7/2007 | Stiles | F04D 15/0077 417/44.1 |
| 2010/0216527 A1* | 8/2010 | Christensen | H04M 1/022 455/575.4 |
| 2011/0286859 A1* | 11/2011 | Ortiz | F04B 49/002 417/20 |
| 2013/0129536 A1* | 5/2013 | Robol | F04B 53/16 417/410.1 |
| 2014/0251002 A1 | 9/2014 | Bulteau et al. | |
| 2015/0175333 A1* | 6/2015 | Richardson | H05K 5/02 206/521 |
| 2018/0328356 A1* | 11/2018 | Ortiz | F04D 13/0686 |
| 2019/0269110 A1* | 9/2019 | Watson | F04B 19/04 |
| 2021/0123441 A1* | 4/2021 | Coupart | H02P 5/747 |
| 2021/0356104 A1* | 11/2021 | Thorne | H01M 50/262 |

OTHER PUBLICATIONS

International Application No. PCT/US2022/017620, International Preliminary Report on Patentability mailed on Sep. 7, 2023, 8 pages.

* cited by examiner

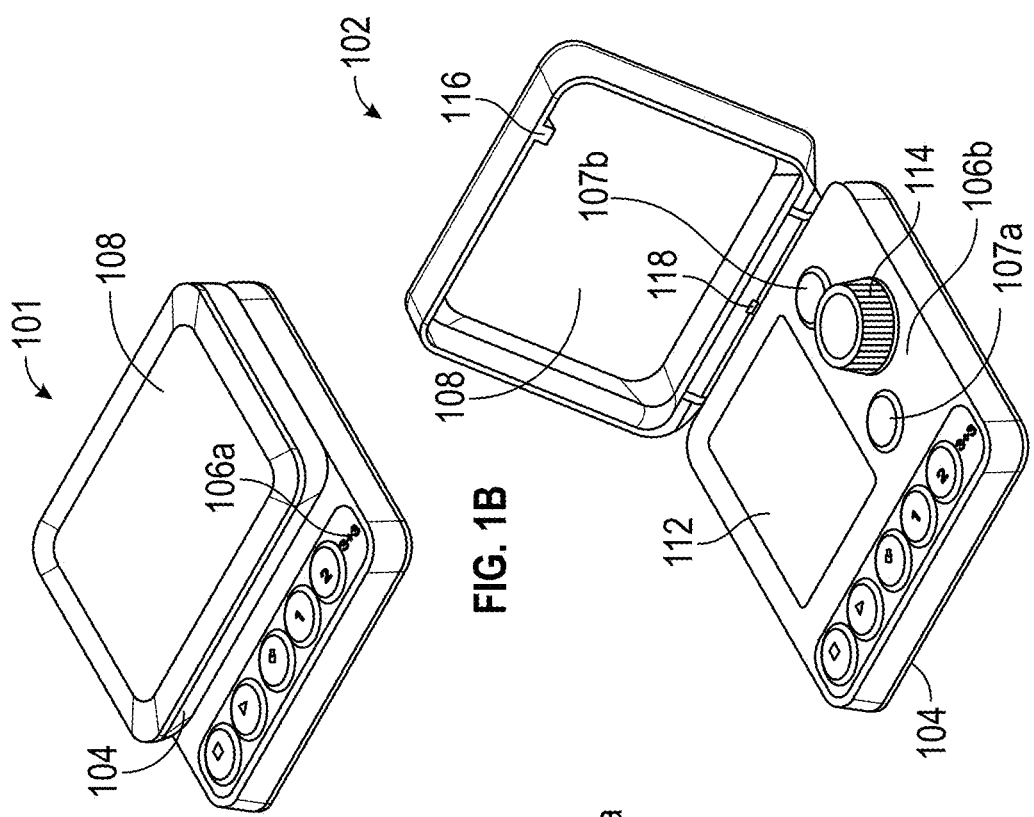
FIG. 1B
FIG. 1C
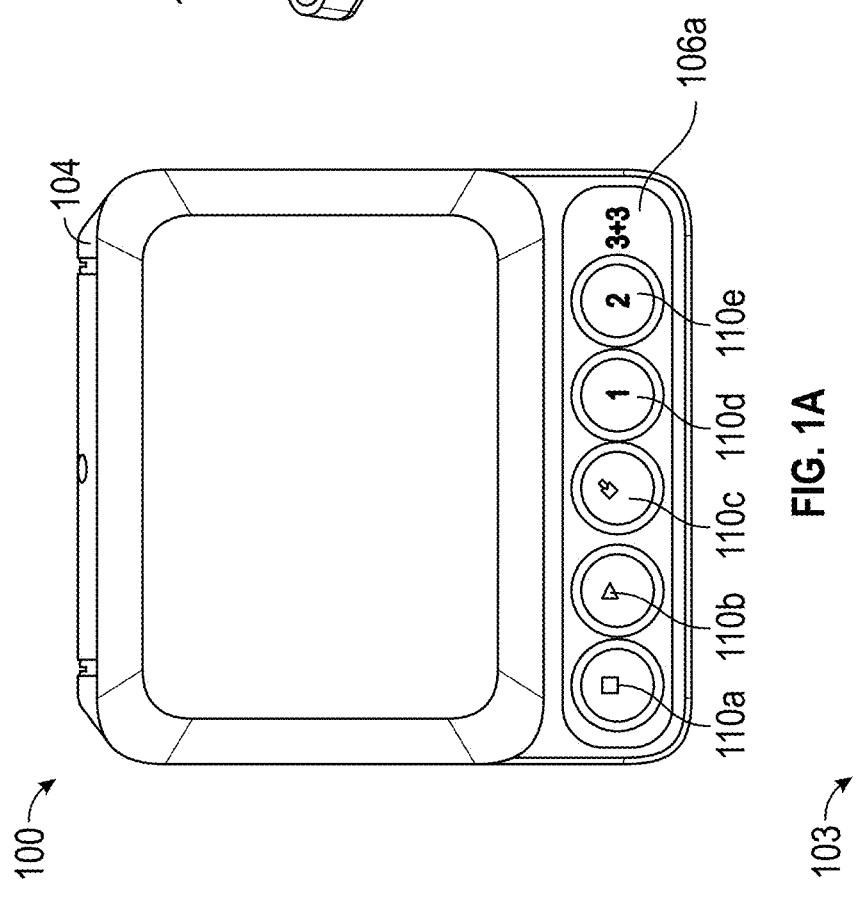
FIG. 1A
FIG. 1D

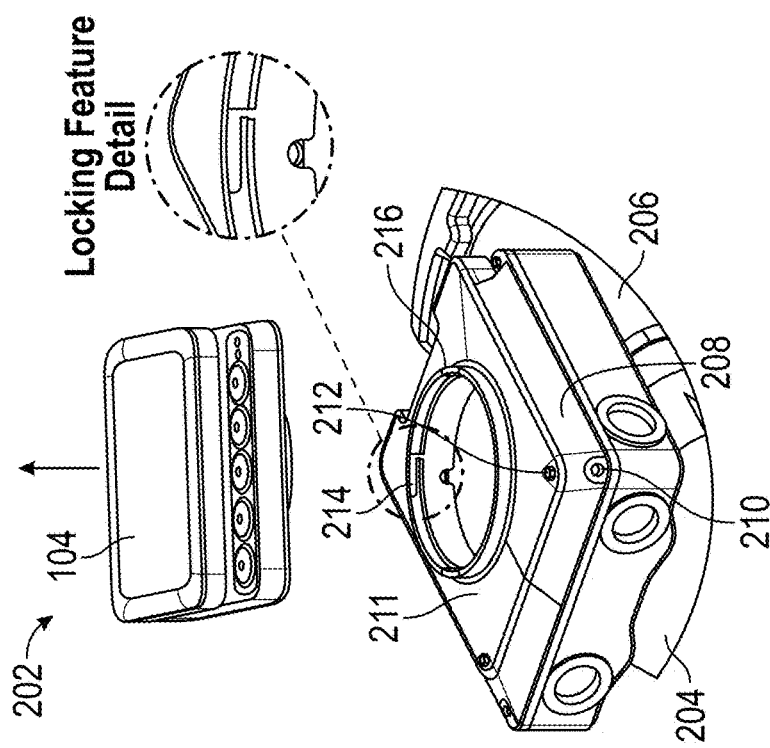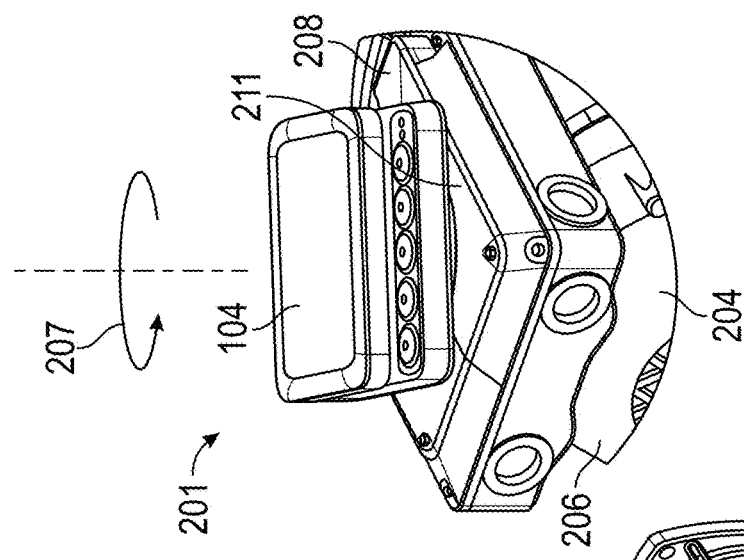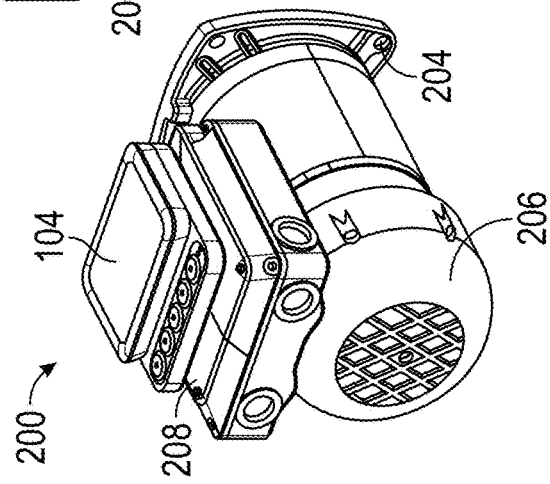

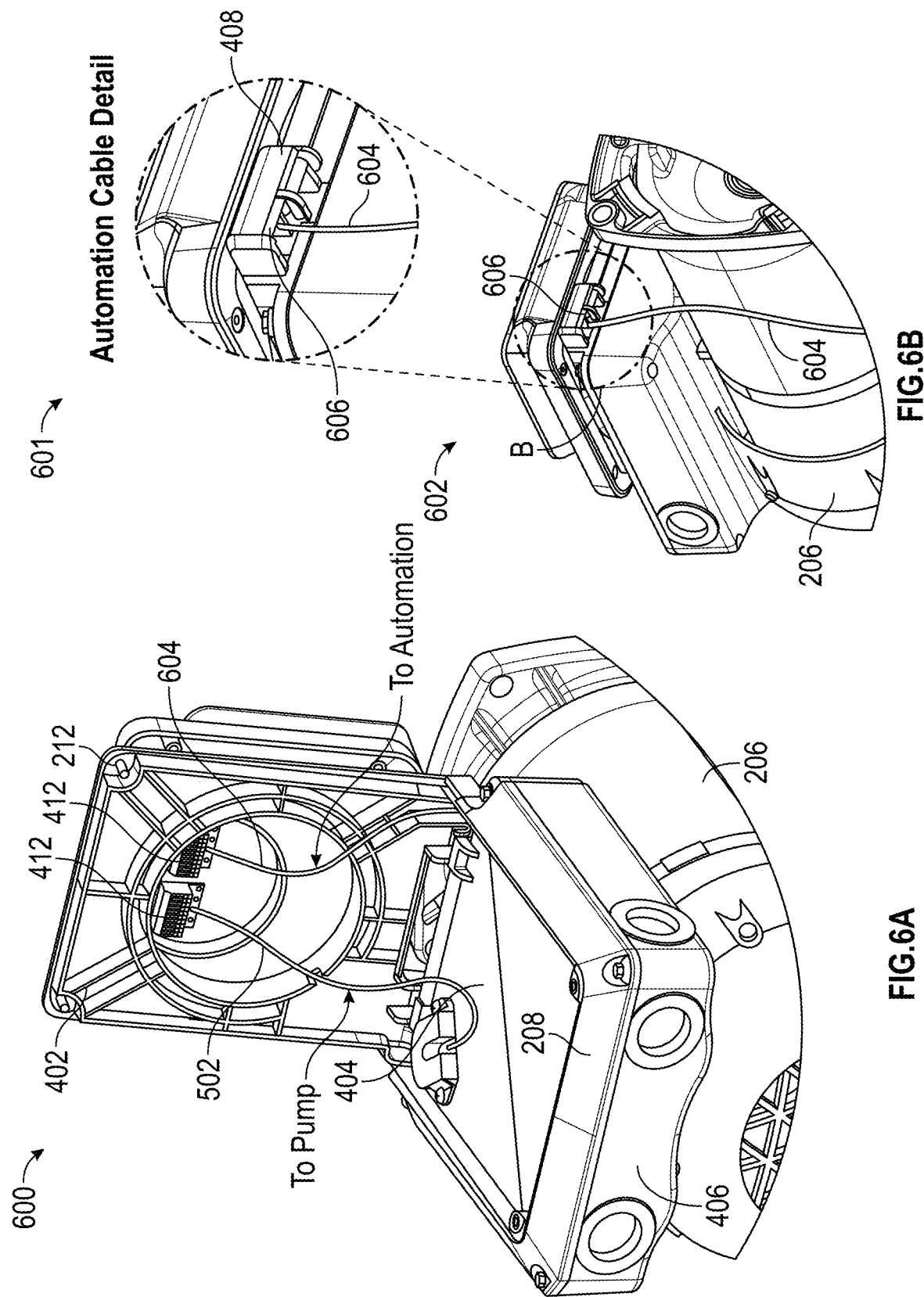

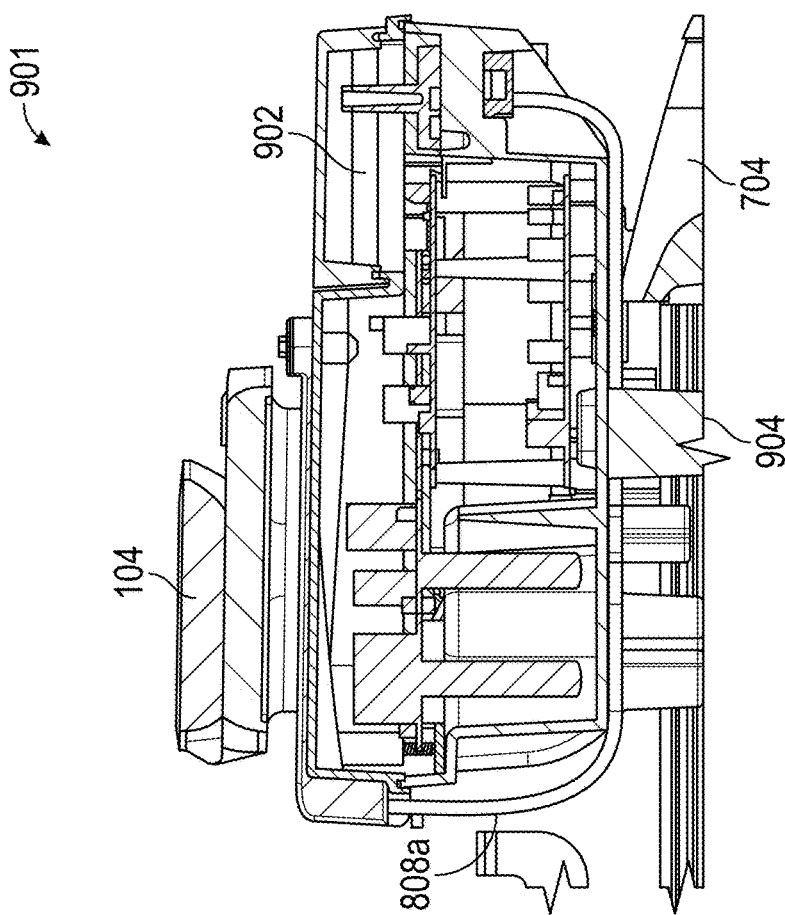
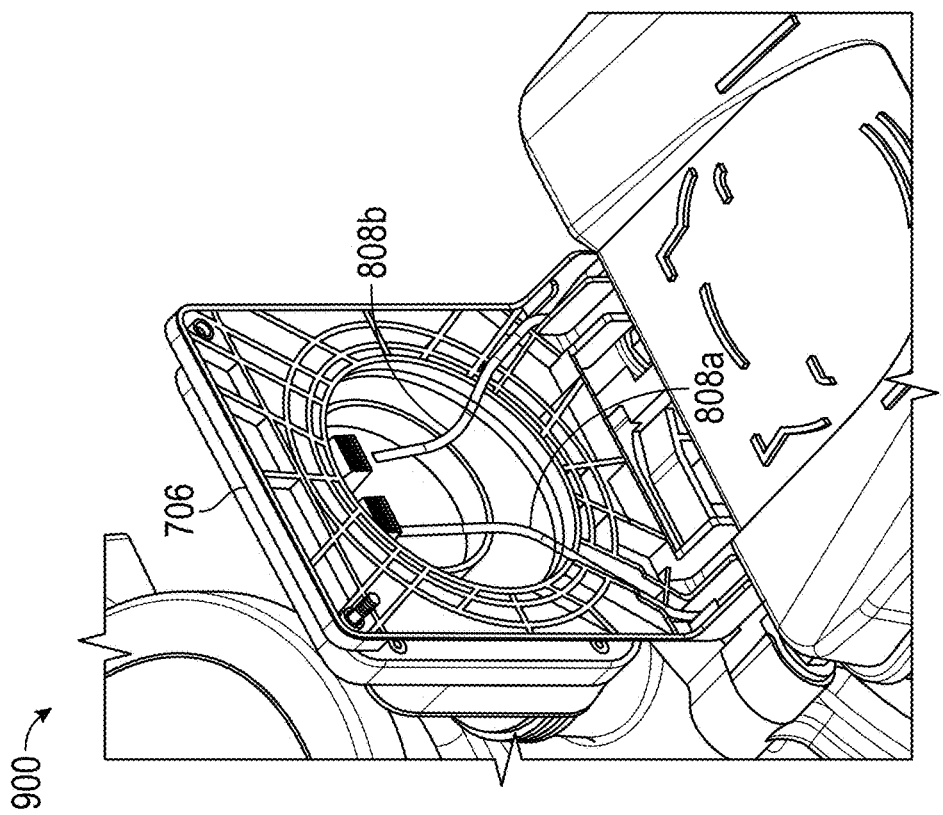
FIG. 9B
FIG. 9A

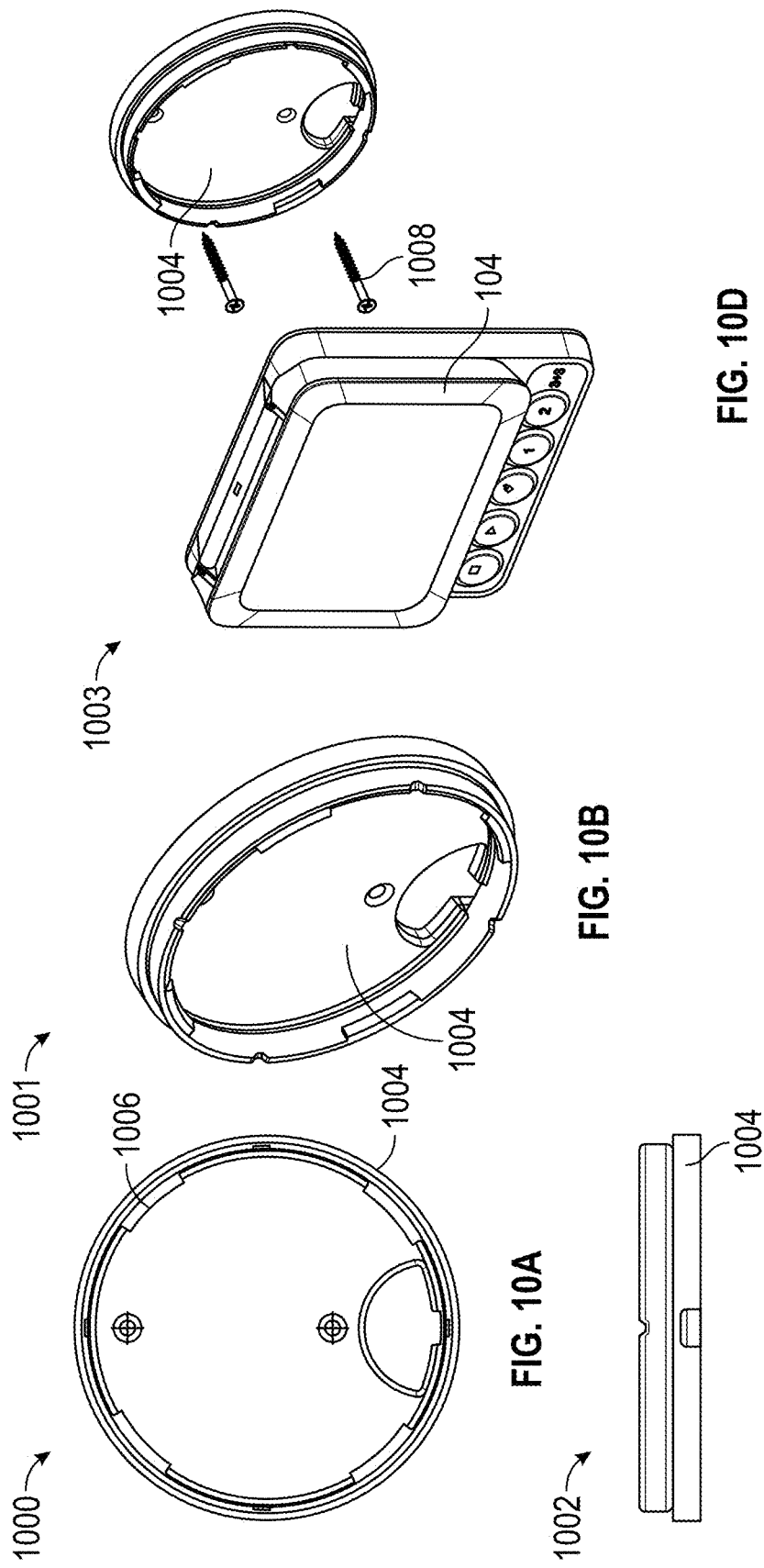

USER INTERFACE FOR PUMPS FOR SWIMMING POOLS AND SPAS

REFERENCE TO RELATED APPLICATION

This application claims the benefit of U.S. Provisional Patent Application No. 63/153,766, filed on Feb. 25, 2021 and entitled USER INTERFACE FOR PUMPS FOR SWIMMING POOLS AND SPAS, the content of which is hereby incorporated by reference in its entirety.

FIELD OF THE INVENTION

This invention relates to pumps for moving fluid in bodies of water such as, but not necessarily limited to, swimming pools and spas and, more particularly, to user interfaces for such pumps.

BACKGROUND OF THE INVENTION

Pumps can be configured to move fluid. For example, pumps used with swimming pools, spas, well pumps, septic systems, and other bodies of water may displace existing fluid. The pumps may be pre-programmed, or may use input from a user for determining operations to perform relating to moving the fluid. A user interface can be provided for pumps that use input from a user.

SUMMARY

Embodiments covered by this patent are defined by the claims below, not this summary. This summary is a high-level overview of various embodiments and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

According to certain embodiments, a user interface for a fluid-moving pump includes at least two interface regions and a cover for covering one of the at least two interface regions.

According to some embodiments, a user interface for a fluid-moving pump is attachable to the fluid-moving pump via a quarter-turn and without the use of tools.

According to various embodiments, a user interface for a fluid-moving pump includes at least two RS-485 connections for communicatively coupling the user interface to the fluid-moving pump and to an automation device.

According to certain embodiments, a user interface for a fluid-moving pump may be attachable on a wall or a pump such that the user interface is mounted on the wall or the pump and oriented into one of four or more predetermined orientations relative to the wall or the pump.

According to various embodiments, a user interface for the fluid-moving pump includes a magnet sensor for sensing whether the cover is open.

According to some embodiments, a method associated with the user interface includes sensing that a cover of an interactive region is open, displaying information relating to a fluid-moving pump, receiving user input via a user interface dial, and performing operations based on the received user input.

According to certain embodiments, a system includes a fluid-moving pump, a user interface, and a hinge for positioning the user interface on the fluid-moving pump. The hinge may be movable between an open position and a closed position to selectively allow access to an interior of the system housing wires connecting the user interface with the fluid-moving pump.

Various implementations described herein can include additional systems, methods, features, and advantages, which cannot necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

FIGS. 1A-D illustrate various views of a user interface according to one or more examples of the present disclosure.

FIGS. 2A-C illustrate various perspective views of a pump and user interface assembly according to one or more examples of the present disclosure.

FIGS. 6A-B illustrate additional perspective views of the pump and user interface assembly of FIGS. 2A-C, including an enlarged view taken at inset circle B.

FIGS. 9A-B illustrate a partial perspective view and a cross-sectional view of the pump and user interface assembly of FIGS. 7A-B.

FIGS. 10A-D illustrate portions of a wall mount user interface assembly and an exploded view of a wall mount user interface assembly according to one or more examples of the present disclosure.

DETAILED DESCRIPTION

Figure 3:
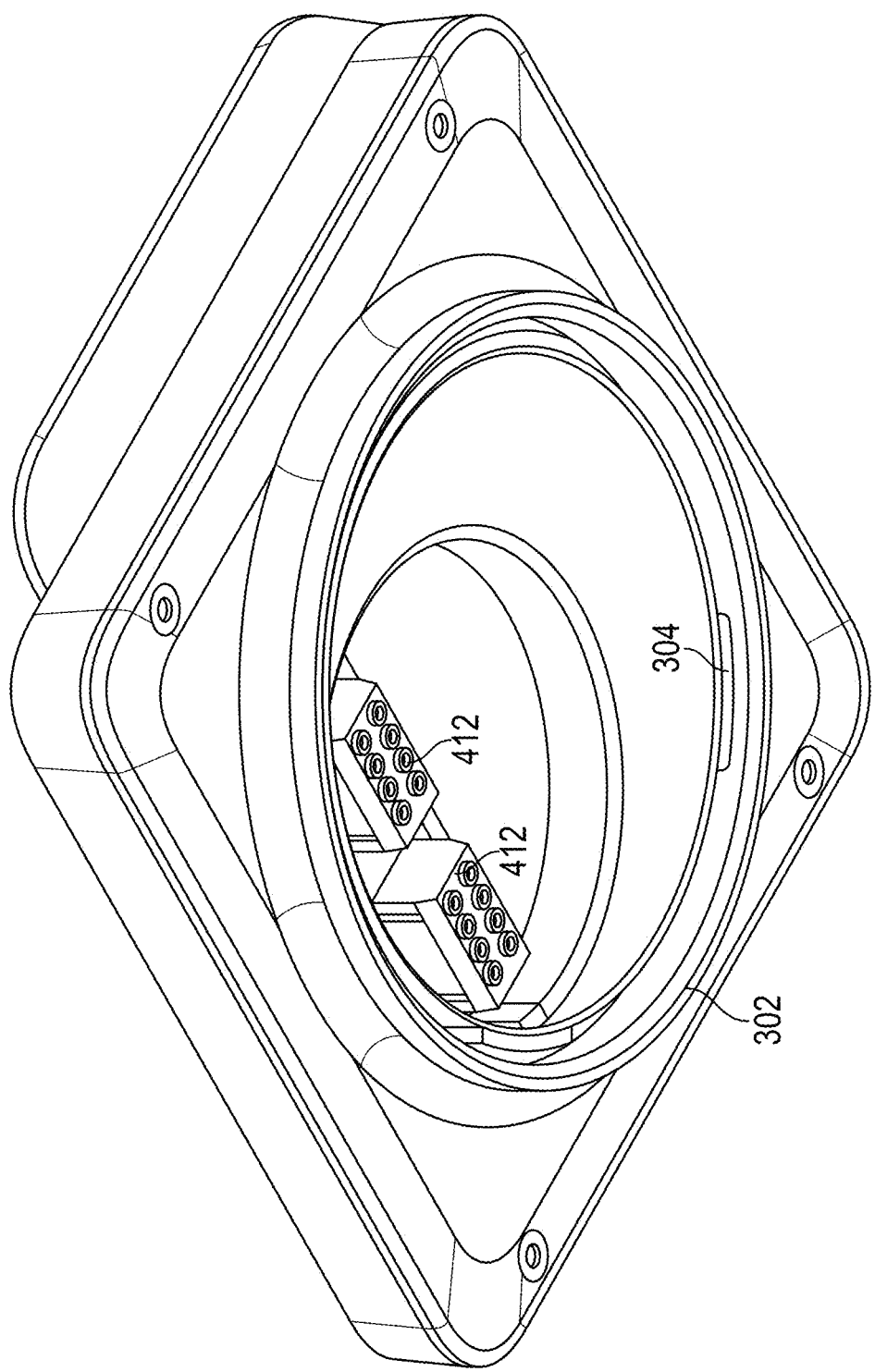
FIG. 3 illustrates an underside perspective view of the user interface of FIGS. 1A-D.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Certain aspects and examples relate to a user interface that is communicatively coupled with a fluid-moving pump and that includes at least two interactive regions for receiving user input to control the fluid-moving pump. In some examples, the user interface may be attached to the fluid-moving pump using a mounting cover and an attachment bracket that can allow attachment or positioning of the user interface relative to the fluid-moving pump via a quarter-turn motion or other suitable methods. In other examples, the user interface can be mounted on a wall or other surface.

In some examples, the user interface can be attached to the fluid-moving pump in such a way that allows the user interface, once installed on the fluid-moving pump or the wall or other surface, to be rotated in a plurality of predetermined positions. In some examples, the user interface can be oriented/rotated into any of four predetermined positions. Additionally or alternatively, in some examples, the user interface can be attached to the fluid-moving pump via an attachment bracket that allows the user interface assembly to move between an open position, in which a user can access wiring of the user interface, and a closed position, in which access to wiring of the user interface is restricted.

In some examples, the user interface includes at least two interactive regions, such as a covered region and an uncovered region. The uncovered region may include various buttons, dials, or other suitable components or areas for receiving user input to cause the fluid-moving pump to perform operations or otherwise adjust settings of the fluid-moving pump. The covered region may include an illuminated screen (as by LEDs, for example) that is usable to program custom functions of the fluid-moving pump and to perform other suitable operations relating to the fluid-moving pump. The covered region may also include various buttons, dials, or other suitable components or areas for receiving user input to cause the fluid-moving pump to perform operations or otherwise adjust settings of the fluid-moving pump. The covered region can be selectively covered by a movable cover.

Illustrative examples are given to introduce the reader to the general subject matter discussed herein and are not intended to limit the scope of the disclosed concepts. The following sections describe various additional features and examples with reference to the drawings in which like numerals indicate like elements, and directional descriptions are used to describe the illustrative aspects, but, like the illustrative aspects, should not be used to limit the present disclosure.

FIGS. 1A-D illustrate various views 100-103 of a user interface 104 according to one or more examples of the present disclosure. The view 100 of FIG. 1A is a top view of the user interface 104 in the closed position, the view 101 of FIG. 1B is a perspective view of the user interface 104 in the closed position, the view 102 of FIG. 1C is a perspective view of the user interface 104 in the open position, and the view 103 of FIG. 1D is a front view of the user interface 104.

As illustrated in FIGS. 1A-D, the user interface 104 includes a first interface region 106a, a second interface region 106b, and an interface cover 108. The interface cover 108 is selectively movable between a closed position (FIG. 1B) and an open position (FIG. 1C). In the closed position, the interface cover 108 selectively covers the second interface region 106b, and in the open position, a user may access both the first interface region 106a and the second interface region 106b. In this way, the user interface 104 functions as a dual user interface.

The user interface 104 may be installed on, or otherwise affixed to, a fluid-moving pump (see, e.g., FIGS. 2A-C, 4A-B, 5, 6A-B, 7A-B, 8A-B, and 9A-B) or a wall or other surface (see, e.g., FIGS. 10A-D and 11A-B). As mentioned above, the user interface 104 includes the interface cover 108 that may be opened or otherwise displaced to expose the second interface region 106b or closed or otherwise displaced to cover the second interface region 106b. In some embodiments, the interface cover 108 may be weather-resistant. For example, during inclement weather like rain, snow, and other forms of precipitation, the interface cover 108 may prevent the precipitation from damaging or otherwise interacting with the second interface region 106b. In some embodiments, the first interface region 106a may be exposed regardless of a position of the interface cover 108, thus providing quick access for a user to interface with this portion of the user interface 104.

The first interface region 106a may include any suitable number and/or types of interactive components such as a set of interactive components 110a-e as shown in FIGS. 1A-D. The interactive components 110 may include tangible or virtual buttons, dials, switches, touch screens, combinations thereof, or other suitable components for receiving input from a user. Interactive components 110a-e are in the form of buttons in the example shown in FIGS. 1A-D, although each of the interactive components need not be of the same type in other examples. Interactive components 110 may execute operations that cause a fluid-moving pump to perform certain functions. For example, one or more of the interactive components 110 may cause the fluid-moving pump to run, stop running, and/or pause running. One or more of the interactive components may also correspond to various long-term or other setting options. The setting options may include various options as desired, including but not limited to settings for affecting characteristics and/or operation of the fluid-moving pump. For example, the interactive components 110 may affect how long the fluid-moving pump will run, how long the fluid-moving pump will rest, how frequently the fluid-moving pump will run, a speed at which the fluid-moving pump will run, a combination thereof, or other desired settings. In some examples, pressing a button (or other interactive component) may select or execute operations corresponding to the pressed button (or other interactive component). In some examples, the first interface region 106a may be a quick-access interface in which a user can select one or more interactive components 110 for causing the fluid-moving pump to perform various operations without having to program the user interface 104 or the fluid-moving pump.

Referring to FIG. 1C, similar to the first interface region 106a, the second interface region 106b may include any suitable number and/or types of interactive tangible or virtual components for receiving input from a user (e.g., buttons, dials, switches, touch screens, combinations thereof, or others). The number and type of interactive components illustrated should not be considered limiting. In some embodiments, and as illustrated in FIG. 1C, the second interface region 106b optionally may include a screen 112 for displaying information relating to the fluid-moving pump to a user. For example, the screen 112 may be an illuminated screen (e.g., an LED-lit screen) that displays settings of the fluid-moving pump, programming options of the fluid-moving pump, and the like.

In certain embodiments, and as illustrated in FIG. 1C, the second interface region 106b may include a user interface dial 114 for adjusting settings of the fluid-moving pump. In some examples, the user interface dial 114 may be used to adjust settings and/or to create new or alternative programs of the fluid-moving pump, and the screen 112 may display the adjustments and/or the programs. In some examples, rotating the user interface dial 114 may change selections displayed by the screen 112 and depressing the user interface dial 114 may execute the selection displayed by the screen 112. For example, a user may adjust a long-term program of the user interface 104 called long-term program A. The user may rotate the user interface dial 114 until long-term program A is displayed, and the user may depress the user interface dial 114 to select long-term program A for accessing details about long-term program A and/or adjusting settings of long-term program A. Subsequent to selecting long-term program A, the user may rotate the user interface dial 114 to scroll through different settings of long-term program A and selecting one or more settings to adjust by depressing the user interface dial 114.

Figure 12:
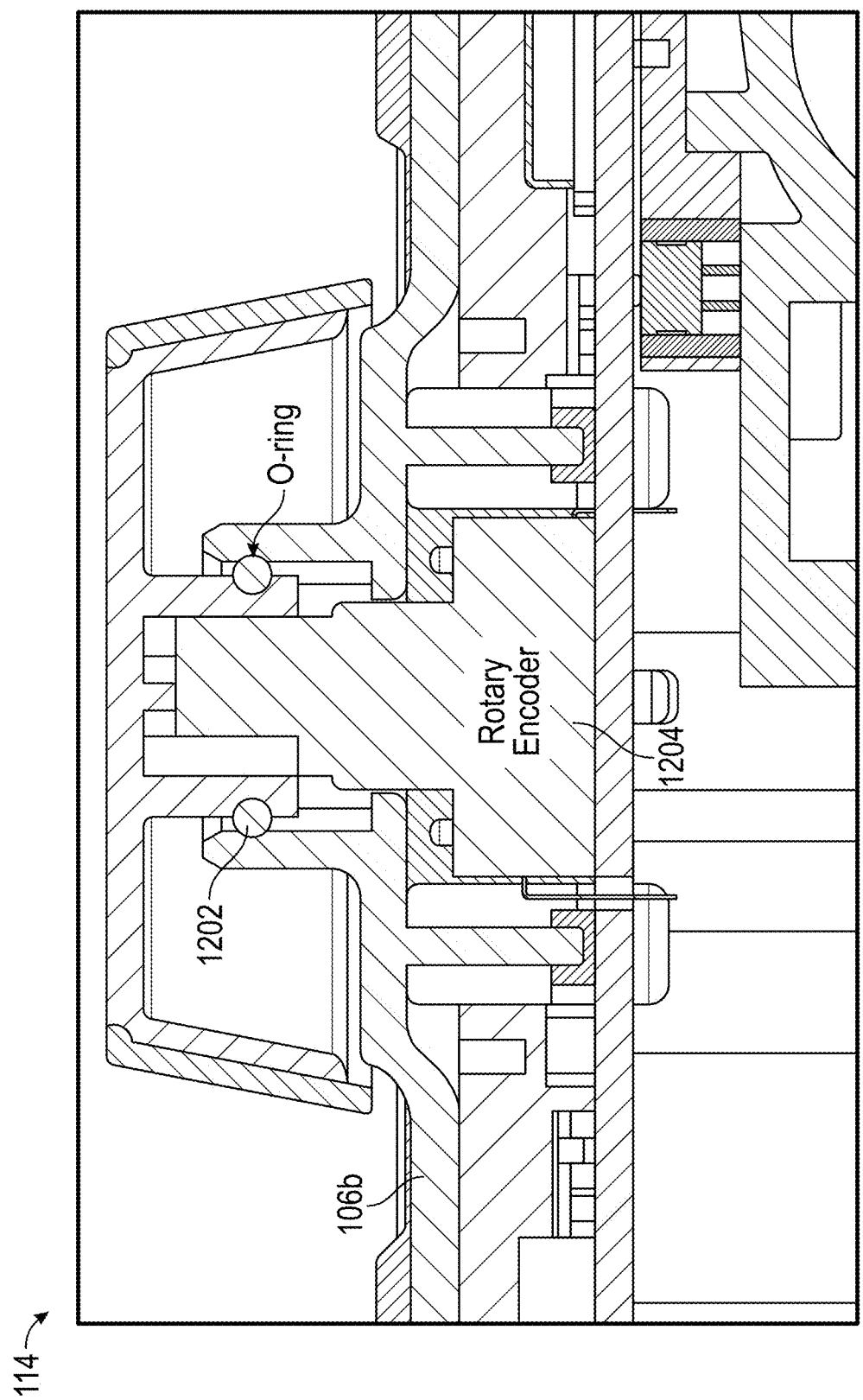
FIG. 12 illustrates a cross-sectional view of the user interface of FIGS. 1A-D.

FIG. 12 is a cross-sectional view of the interface dial 114 described above. The interface dial 114 may include an O-ring 1202 that seals a rotary encoder 1204 from moisture or other debris that may damage the rotary encoder 1204 or the user interface 104. As described above, the interface dial 114 may be positioned on the second interface region 106b of the user interface 104 and may receive user input via rotation and depression. For example, the user may depress the user interface dial 114 to select an existing program, may rotate the user interface dial 114 to highlight a different setting of the existing program, and may depress the user interface dial 114 to select or execute the different setting.

Referring back to FIGS. 1A-D, in the embodiment illustrated, the second interface region 106b also includes two buttons 107a-b that can be used to control and/or adjust either the user interface 104 itself (e.g., turning the screen 112 on/off or displaying a menu of options) or a feature of the fluid-moving pump. Any number of buttons or other tangible or virtual interactive components may be included.

In certain embodiments, and as best illustrated in FIG. 1C, the interface cover 108 optionally may include a magnet 116 or other sensor positioned on an interior surface of the interface cover 108. The particular location of the sensor illustrated in FIG. 1C should not be considered limiting. The magnet 116 may be a typical magnet or may be a magnet sensor. In an example in which the magnet 116 is a typical magnet, upon closing the interface cover 108, the magnet 116 may exert a light (or minimum) force for retaining the interface cover 108 in a closed position until the user manually overcomes the magnetic force and opens the interface cover 108. In an example in which the magnet 116 is a magnet sensor, the magnet 116 may sense whether the interface cover 108 is open, and the magnet 116 may cause the screen 112 to illuminate in response to sensing that the interface cover 108 is open. Other sensors or closure features may be used in lieu or in addition to the magnet 116.

The user interface 104 may also include an interference feature such as, but not limited to, a nub 118 that may help hold the interface cover 108 in position (e.g., against the wall or fluid-moving pump when in the closed position and help retain the interface cover 108 in the open position when opened).

FIGS. 2A-C, 4A-B, 5, 6A-B, 7A-B, 8A-B, and 9A-B illustrate non-limiting examples of the user interface assembly 104 mounted on a fluid-moving pump to form a pump and user interface assembly.

FIGS. 2A-C illustrate various views 200-202 of a pump and user interface assembly 204 including the user interface assembly 104 mechanically coupled to a pump 206, such as a variable speed pump or any other suitable pump as desired. The pump 206 may be a swimming pool pump, a spa pump, a well pump, or any other suitable pump for moving fluid. The view 200 of FIG. 2A is a perspective view of the pump and user interface assembly 204, the view 201 of FIG. 2B is a perspective view of the pump and user interface assembly 204 in which the user interface 104 is in a different orientation compared to the user interface 104 of the view 200, and the view 202 of FIG. 2C is a perspective view of the pump and user interface assembly 204 with the user interface 104 detached from the pump 206. The user interface 104 may receive input, as described with respect to FIGS. 1A-D, from a user and/or an automation device for controlling the pump 206.

As illustrated in FIGS. 2A-C, in certain embodiments, a mounting cover 208 may attach or otherwise position the user interface 104 on or relative to the pump 206. In some embodiments, and as illustrated in FIGS. 2A-C, the mounting cover 208 may be positioned on a top portion of the pump 206. The mounting cover 208 may be affixed to, or otherwise positioned on, any other suitable location of the pump 206. The mounting cover 208 may be coupled to the pump 206 using any suitable mechanism or device as desired. In the embodiment illustrated and as best seen in FIG. 2C, mechanical fasteners such as a first set of screws 210 may couple the mounting cover 208 to the pump 206.

In certain embodiments and as best illustrated in FIGS. 2B-C, a hinge or attachment bracket or other hinge mechanism 211 may be affixed to the mounting cover 208. The hinge mechanism 211 may be attached to the mounting cover 208 using any suitable technique or mechanism as desired. In the embodiment illustrated, a second set of screws 212 attach the hinge mechanism 211 to the mounting cover 208. As described in more detail below, the attachment bracket 211 is movable with respect to the mounting cover 208 to selectively allow access to an interior of the pump and user interface assembly 204. As described in more detail below, the interior of the pump and user interface assembly 204 may house wiring that communicatively couples the user interface 104 with the pump 206.

The mounting cover 208 may be configured such that the user interface 104 can be affixed to, or otherwise positioned on, the pump 206 without using tools (i.e., tool-less assembly). For example, the user interface 104 may be (i) positioned on the mounting cover 208 and the attachment bracket 211 and (ii) rotated by about 90 degrees, or a quarter-turn, with respect to the pump 206 (represented by arrow 207 in FIG. 2B). Any other suitable number of degrees can be usable for rotating the user interface 104 to lock the user interface 104 on the mounting cover 208. The quarter-turn can, in some examples, lock the user interface 104 on the mounting cover 208 and the attachment bracket 211, which secures the user interface 104 in position on the pump 206.

Referring to FIG. 3, in certain embodiments the underside of the user interface 104 may include an attachment interface 302. During assembly of the user interface 104 with the pump 206, the attachment interface 302 may cooperate with a corresponding attachment interface 216 of the attachment bracket 211 to lock the user interface 104 onto the mounting cover 208 to be positioned on the pump 206 (see FIG. 2C). In some embodiments, the attachment interface 302 may include at least two leads such as lead 304. The lead 304 allows the user interface 104 to interlock with the attachment bracket 211 (such as by the quarter-turn described above). For example, the user may position the user interface 104 on the attachment bracket 211 such that the lead 304 abuts a locking feature 214 of the attachment bracket 211. The locking feature 214 may guide the user interface 104 into a locked position subsequent to the user performing the quarter-turn. Increasing the number of leads 304 included in the attachment interface 302 increases a number of potential orientations of the user interface 104 relative to the pump 206 for the end user. For example, if the attachment interface 302 includes four leads 304, then an installer or other user may position the user interface 104 with respect to the mounting cover 208 in one of four different, predetermined orientations using quarter-turns. A different number of predetermined orientations may be provided by altering the number of leads provided.

Referring back to FIGS. 2A-C, the view 202 illustrates the user interface 104 before being positioned on the mounting cover 208 and the attachment bracket 211, the view 201 illustrates the user interface 104 being positioned on the mounting cover 208 and the attachment bracket 211, and the view 200 illustrates the user interface 104 affixed to the pump 206 subsequent to being rotated the quarter-turn to lock the user interface 104 on the mounting cover 208 and the attachment bracket 211. The view 200 illustrates the user interface 104 in one orientation, but, as described above, the user may position the user interface 104 on the pump 206 in any other suitable, predetermined orientation with respect to the pump 206. The attachment bracket 211 may additionally include a locking feature 214 that, subsequent to the user rotating the user interface 104 the quarter-turn, causes the user interface 104 to be locked on the mounting cover 208. As mentioned above, once the user interface 104 is installed on the pump 206, the user interface 104 is movable with respect to the pump 206 via the attachment bracket 211.

Figure 4B:
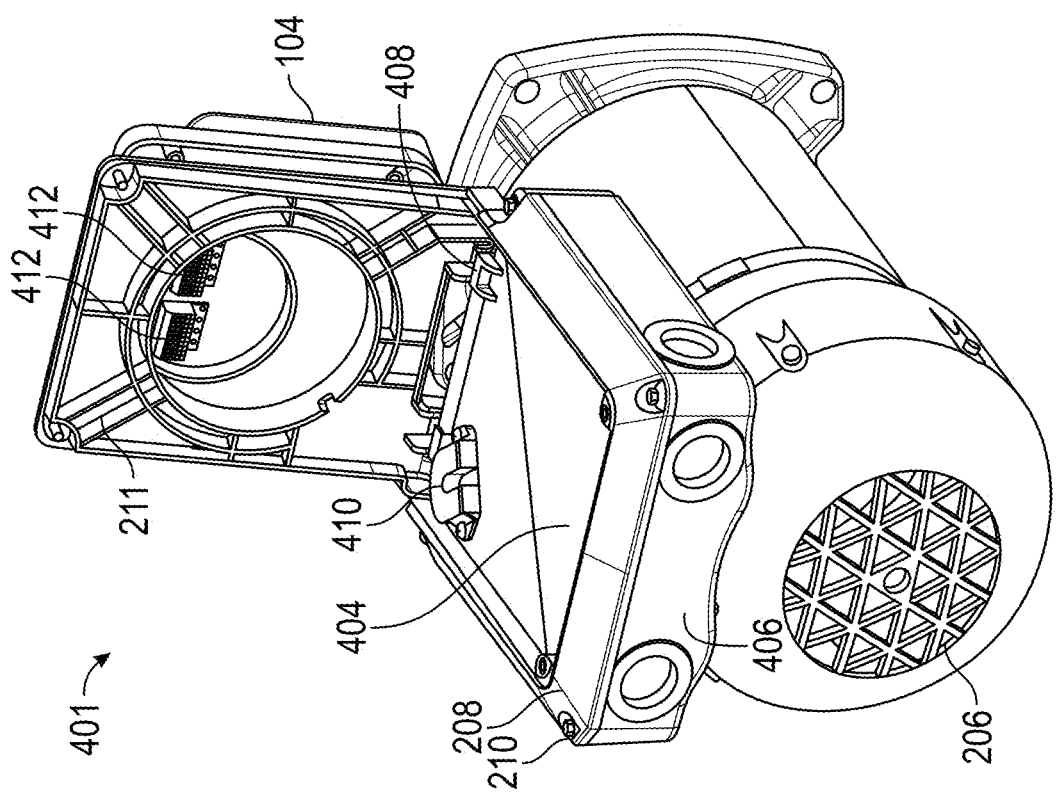
FIGS. 4A-B illustrate perspective views of the pump and user interface assembly of FIGS. 2A-C, with FIG. 4A illustrating the assembly in a closed position and FIG. 4B illustrating the assembly in an open position.
Figure 4A:
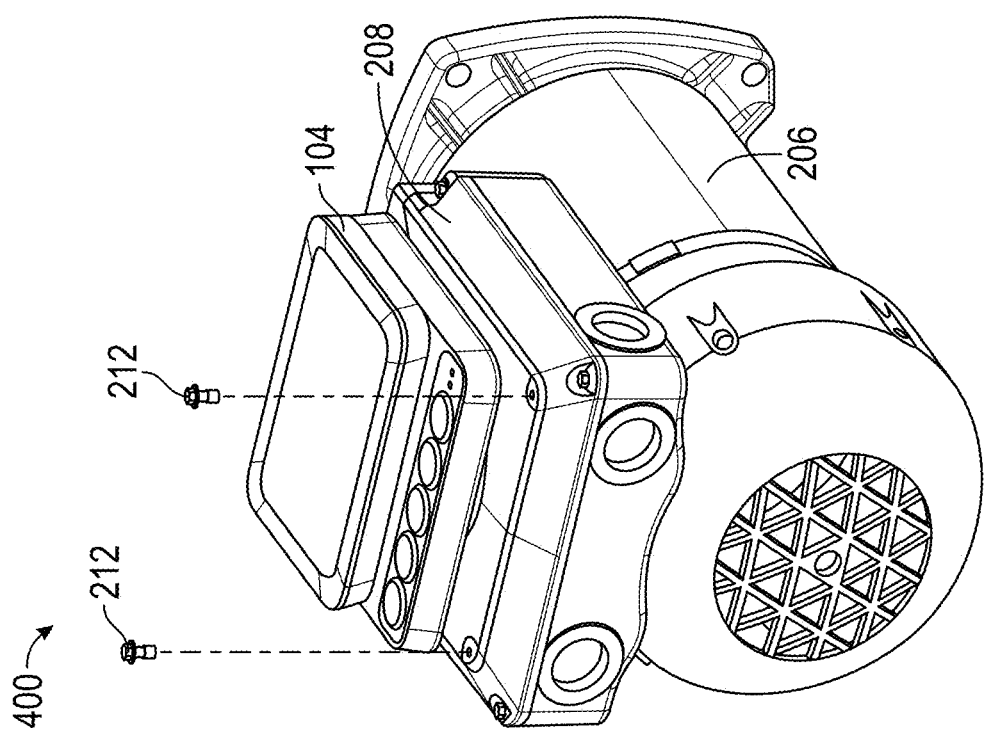

FIGS. 4A-B show the pump and user interface assembly 204 in an open position (view 401 of FIG. 4A) and a closed position (view 400 of FIG. 4B). In some examples, a user may open the attachment bracket 211 by removing the second set of screws 212 from attachment bracket 211 and the mounting cover 208. Subsequently, the attachment bracket 211 may be lifted to expose an interior/wire region 404 of the mounting cover 208. In certain embodiments, the mounting cover 208 may be stationary with respect to the pump 206 regardless of whether the attachment bracket 211 is open or closed. In such embodiments, the mounting cover 208 optionally may be retained in position on a motor drive housing 406 of the pump 206 by the first set of screws 210. The attachment bracket 211 is movable relative to the mounting cover 208 using hinges 408 or other suitable features or mechanisms that connect the attachment bracket 211 and the mounting cover 208.

The interior/wire region 404 optionally may include a wire clamp 410 that retains one or more wires within the interior/wire region 404. As shown in FIGS. 3 and 4AB, the user interface 104 optionally may include one or more communication connections/connectors, for communicatively coupling the user interface 104, the pump 206, an automation device, a combination thereof, and/or any other suitable device for causing the pump 206 to operate. In the embodiment illustrated, the communication connections/connectors are RS-485 connectors 412; however, as mentioned, any other type of communication connections/connectors may be used as desired. In the example illustrated, the user interface 104 includes two RS-485 connectors 412, one of which connects the user interface 104 with the pump 206 and the other of which connects the user interface 104 with an automation or other device of the swimming pool, spa, or other body of water in which the pump 206 operates.

Figure 5:
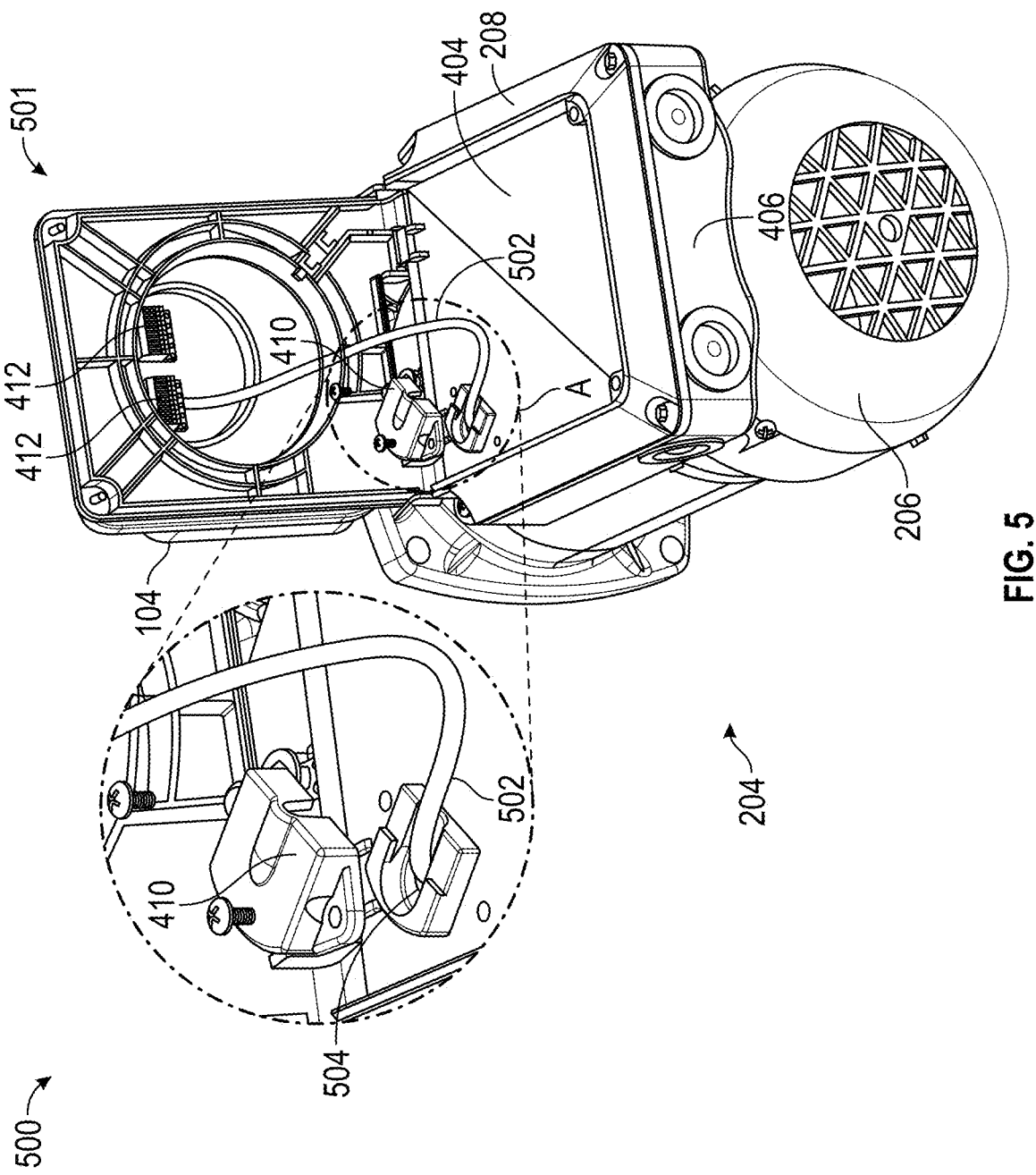
FIG. 5 illustrates another perspective view of the pump and user interface assembly of FIGS. 2A-C, shown in the open position, including an enlarged view taken at inset circle A.

FIG. 5 illustrates two views 500 and 501 of a wire 502 that communicatively couples the user interface 104 to the pump 206 via one of the connectors 412. The view 500 is an enlarged view of the wire 502 and the wire clamp 410, and the view 501 is a perspective view of the pump and user interface assembly 204 that includes the wire 502. In certain embodiments, the wire 502 may be retained in the interior/wire region 404 via the wire clamp 410 in which the wire clamp 410 clamps or otherwise mechanically contacts the wire 502 to retain the wire 502 within the wire region 404. In some embodiments, the wire clamp 410 may be affixed to the mounting cover 208 using various mechanisms or devices as desired, including but not limited to mechanical fasteners such as screws. In some embodiments, the wire 502 may be directed through an access port 504 of the mounting cover 208. In certain embodiments, the wire clamp 410 may prevent or minimize water or other moisture from intruding into the motor drive housing 406 via the access port 504. The wire 502 may be directed through the access port 504 to the motor drive housing 406 and may be connected to one of the RS-485 connectors 412 for communicatively coupling the user interface 104 and the pump 206.

FIGS. 6A-B illustrate various views 600-602 of the pump and user interface assembly 204 that includes wire 502 as well as second wire 604 according to one or more examples of the present disclosure. The view 600 of FIG. 6A is a perspective view of the pump and user interface assembly 204 with the attachment bracket 211 in the open position and illustrating a second wire 604 extending from the second of the connector 412 into the interior/wire region 404. The view 601 of FIG. 6B is an enlarged view of a second access port 606, and the view 602 of FIG. 6B is a perspective view of the pump and user interface assembly 204 and the second wire 604.

In some examples, the wire 502 may be a first wire 502, and the second wire 604 may be connected to one of the RS-485 connectors 412. As illustrated in FIG. 6B, the second wire 604 may be directed through a second access port 606 for connecting to an automation or other device (not shown). In certain embodiments, the second access port 606 may be positioned proximate to, in, or around the hinge 408 that connects the mounting cover 208 and the attachment bracket 211. In this example, the automation device and the user interface 104 may be communicatively coupled to the pump 206. As illustrated, the first wire 502 and the second wire 604 are positioned parallel to one another. However, in some examples, the first wire 502 and the second wire 604 can be crossed in which the first wire 502 and the second wire 604 are connected to the opposite RS-485 connectors 412.

In certain embodiments, the system may allow the automation device to connect directly with the pump 206 without requiring connection through the user interface 104 (e.g., through a first path option), or the automation device can connect indirectly with the pump through the user interface 104 (e.g., through a second path option), thus creating a more modular system. With the first path option, an automation device may have its own user interface that connects directly to a pump (such as pump 206) to control the pump. In this configuration, the user interface 104 of the pump is not required, resulting in cost savings. With the second path option, the automation device connects to the user interface 104 of the pump 206, with the user interface 104 then connecting to the pump 206 or other suitable pump. This second path option is beneficial because it does not require access to the automation user interface to service the pump; instead an operator can use the user interface 104 of the pump to temporarily interrupt its connection to the user interface of the automation device, complete service on the automation device using the user interface 104, and then re-establish the connection between the user interface 104 and the user interface of the automation device. As noted above, because the system has a plurality of possible connection path options (e.g., the first path option, the second path option, etc.), the system is more flexible compared to traditional systems because the system can be operated through a desired connection path option (e.g., it can be operated through either the first path option or the second path option, depending on which is desired).

In some examples, the user may open the attachment bracket 211 by removing the second set of screws 212 for accessing the wire region 404 to adjust or rearrange the first wire 502 and/or the second wire 604 or to perform any other suitable operations relating to the interior/wire region 404 within the mounting cover 208.

Figure 7B:
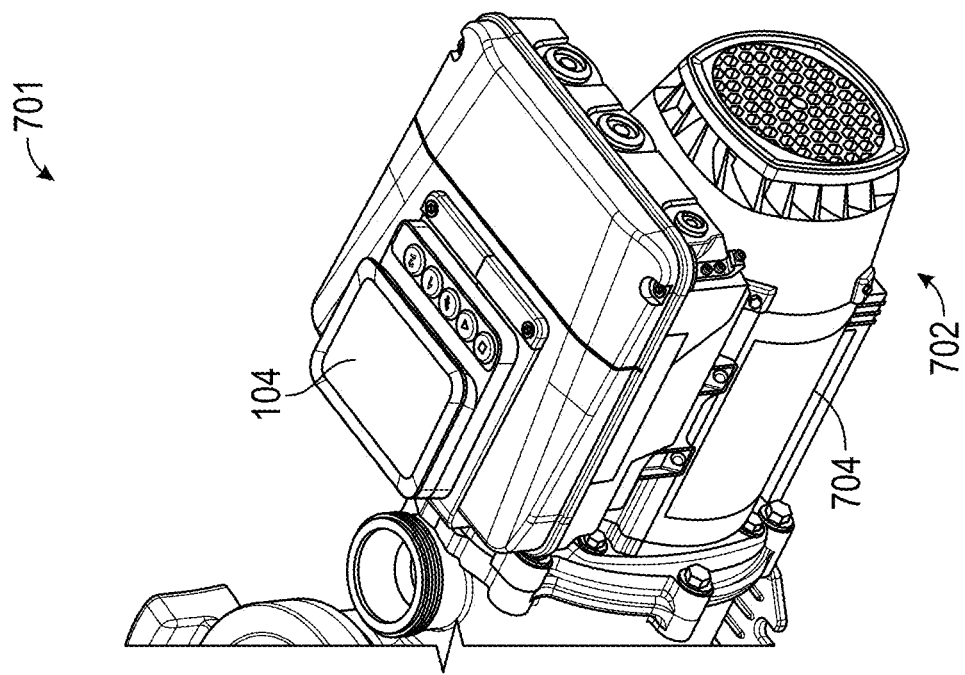
FIGS. 7A-B illustrate two perspective views of another pump and user interface assembly according to one or more examples of the present disclosure.
Figure 7A:
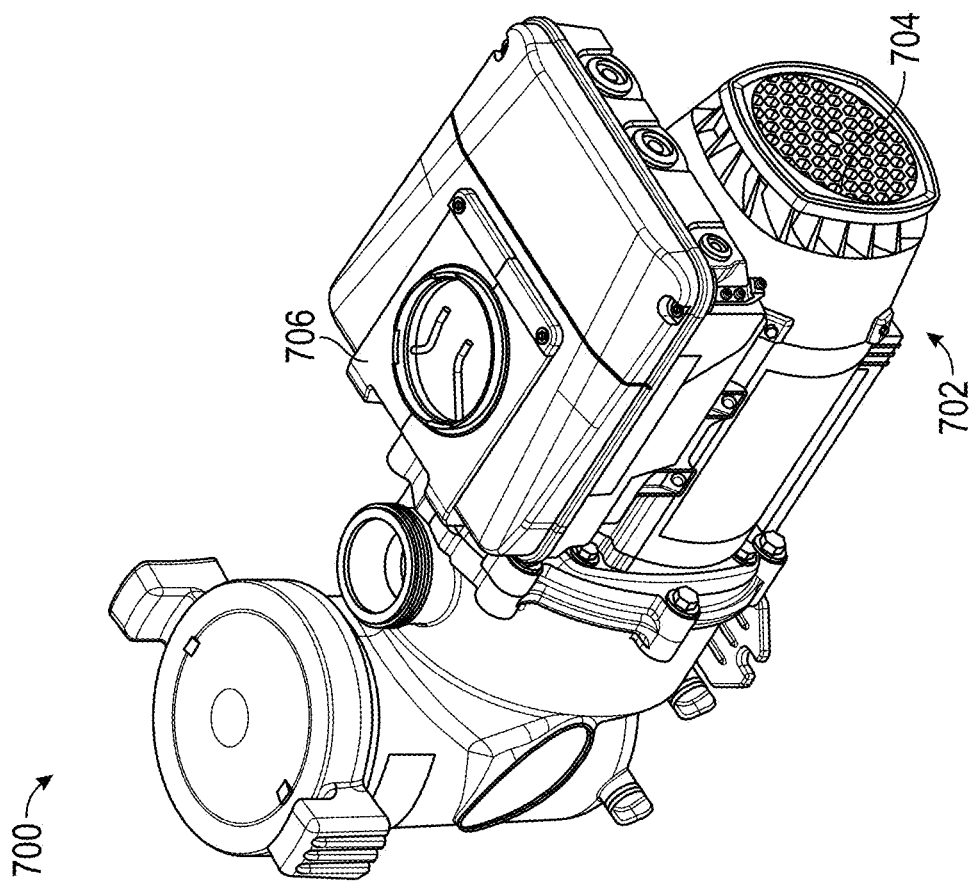

FIGS. 7A-B illustrate two views 700 and 701 of a pump and user interface assembly 702, including the user interface 104 described above coupled to a different pump 704. The view 700 of FIG. 7A is a perspective view of the pump and user interface assembly 702 without the user interface 104, and the view 701 of FIG. 7B is a perspective view of the pump and user interface assembly 702 that includes the user interface 104. The view 701 illustrates the user interface 104 positioned on the pump 704. The view 700 illustrates a attachment bracket 706 that can be used to affix or otherwise position the user interface 104 on the pump 704. The user interface 104 may be positioned on the pump 704 using the attachment bracket 706 in a method similar or identical to the method described with respect to FIGS. 2A-C and 3 relating to the quarter-turn.

Figure 8B:
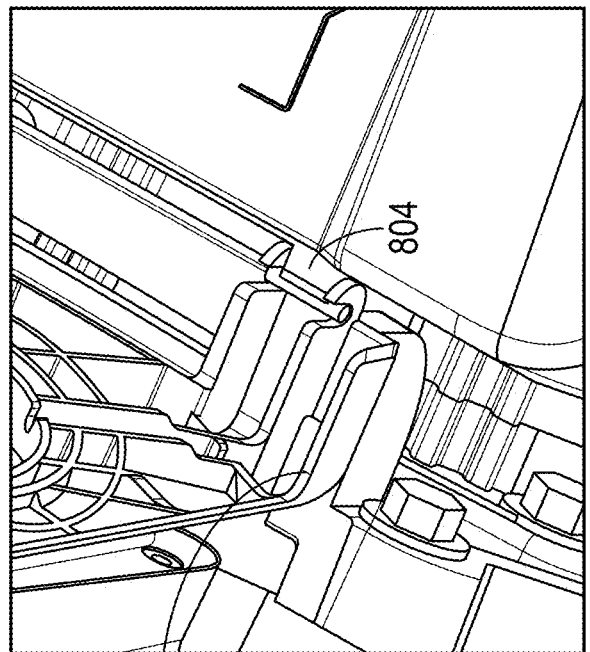
FIGS. 8A-C illustrate various views of the pump and user interface assembly of FIGS. 7A-B.
Figure 8C:
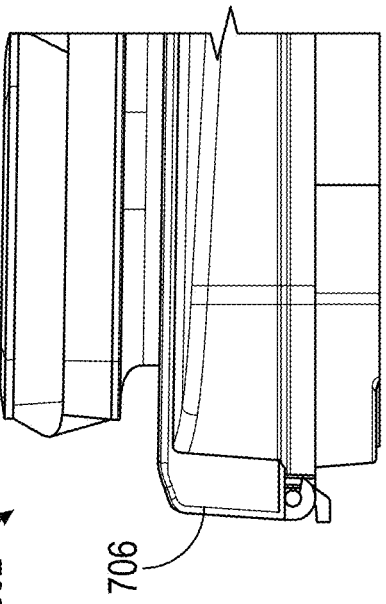
Figure 8A:
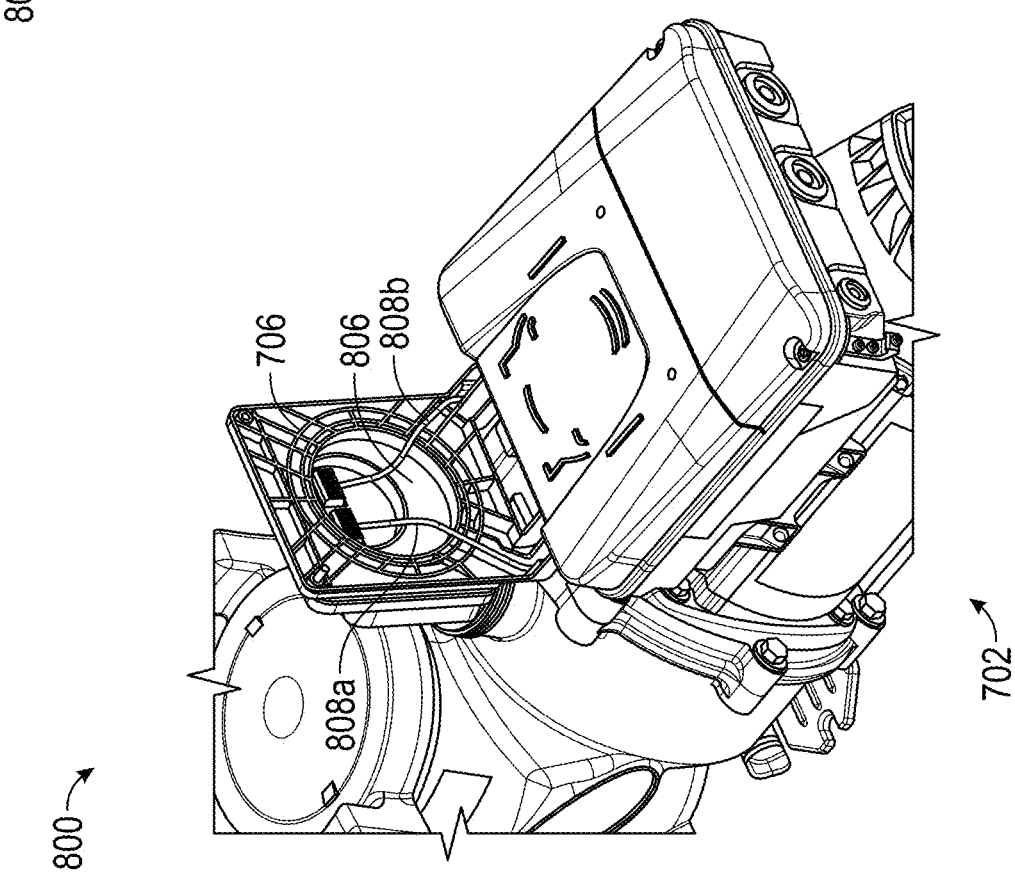

FIGS. 8A-C illustrates various views 800-802 of the attachment bracket 706 of the pump and user interface assembly 702. The view 800 of FIG. 8A is a perspective view of the pump and user interface assembly 702, the view 801 of FIG. 8B is an enlarged view of a hinge 804 of the attachment bracket 706, and the view 802 of FIG. 8C is a side-view of the attachment bracket 706. The view 800 illustrates the pump and user interface assembly 702 with the attachment bracket 706 open, allowing a user to access a wire region 806 of the pump and user interface assembly 702. The hinge 804 may mechanically couple the attachment bracket 706 to the pump 704 and may allow the attachment bracket 706 to be opened for accessing the wire region 806. The wire region 806, similar to the wire region 404, may include two wires 808*a-b* for communicatively coupling the user interface 104 and an automation device (not shown) to the pump 704. The wire region 806 may include only one, or more than two, wires as desired.

FIGS. 9A-B illustrate two views 900 and 901 of wires 808*a-b* that are included in the pump and user interface assembly 702. The view 900 of FIG. 9A is a perspective view of the attachment bracket 706 in an open position, and the view 901 of FIG. 9B is a cross-sectional side-view of a top portion 902 of the pump 704. The view 900 illustrates the attachment bracket 706 in an open position for accessing or otherwise exposing the wire region 806 of the attachment bracket 706. The wires 808 may be included in the wire region 806, retained in the wire region 806, or a combination thereof. The wire 808*b* may communicatively couple the pump 704 to the automation device. The wire 808*a* may communicatively couple the pump 704 to the user interface 104, and the wire 808*a* may be directed through a pump access 904 positioned underneath the user interface 104. As illustrated, the wires 808 are positioned parallel to one another. In some examples, the wires 808 are connected to the opposite RS-485 connectors such that the wires 808 are crossed.

As mentioned above, the user interface 104 may be mounted on a wall or other surface instead of directly on the pump. FIGS. 10A-D illustrates various views 1000-1003 of a wall mount 1004 and a user interface 104 according to one or more examples of the present disclosure. The view 1000 of FIG. 10A is a front-view of the wall mount 1004, the view 1001 of FIG. 10B is a perspective view of the wall mount 1004, the view 1002 of FIG. 10C is a side-view of the wall mount 1004, and the view 1003 of FIG. 10D is a perspective view of the wall mount 1004 and the user interface 104.

In certain embodiments, and as illustrated in the view 1000 of FIG. 10A, the wall mount 1004 has four leads 1006 that are similar or identical to the leads 304 described with respect to FIG. 3; however in other embodiments, the wall mount 1004 may include any number of leads 1006 as desired. The wall mount 1004 that includes the leads 1006 may allow the user interface 104 to be mounted on a wall via the wall mount 1004, in a manner similar or identical to the quarter-turn, in more than one orientation with respect to the wall. For example, if the wall mount includes four leads 1006, then the user interface 104 may be mounted on the wall mount 1004 in one of four different, predetermined orientations.

View 1003 of FIG. 10D illustrates the user interface 104 and the wall mount 1004. The wall mount 1004 may be affixed or otherwise positioned on the wall using any suitable mechanism or combinations of mechanisms as desired. In the embodiment illustrated, mechanical fasteners such as a set of screws 1008 are provided to affix the wall mount 1004 on a wall. The screws 1008 may mechanically couple the wall mount 1004 to the wall, and the user interface 104 may be mechanically coupled to the wall mount 1004. In some examples, the user interface 104 additionally can be communicatively coupled to the pump 206, the pump 704, or any other suitable pump for receiving input from the user interface 104.

Figure 11B:
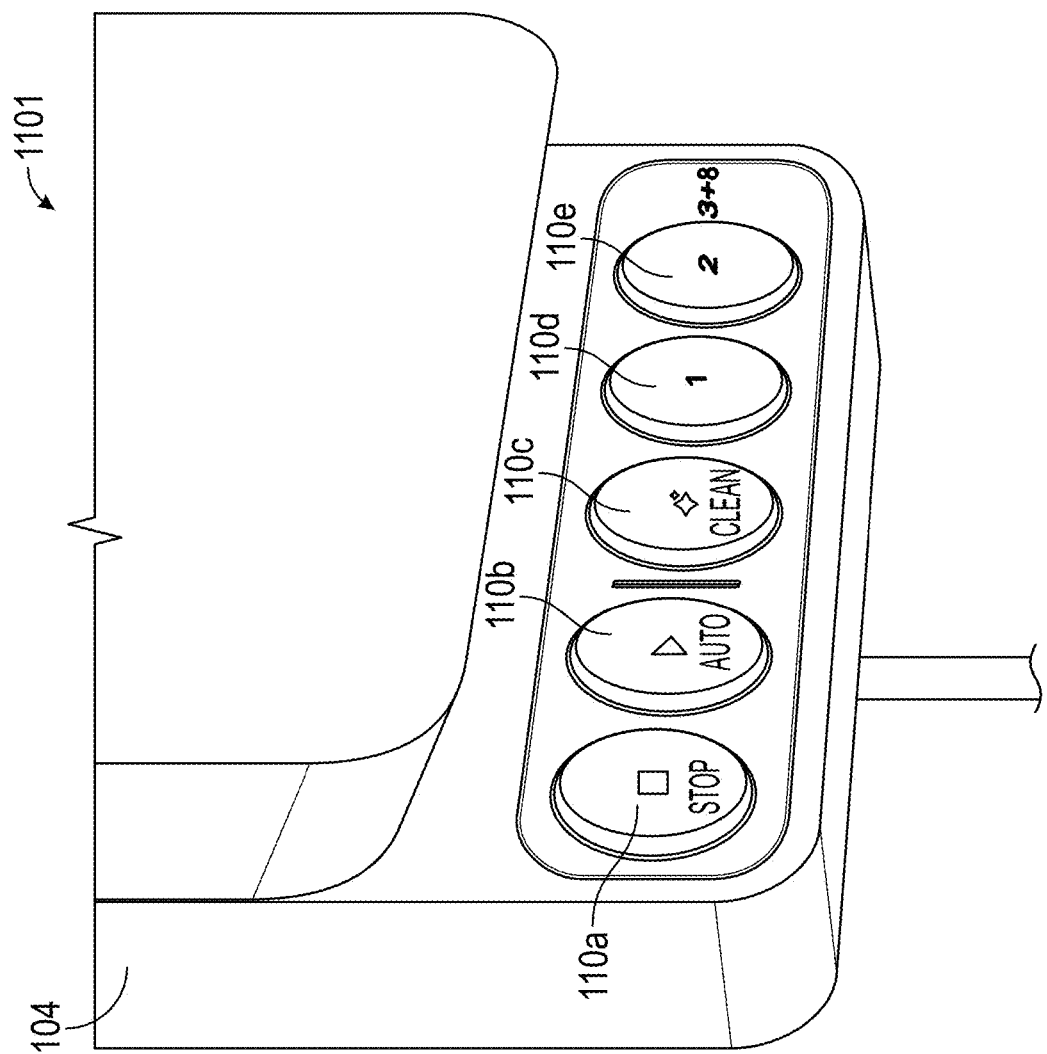
FIGS. 11A-B illustrate two views of a user interface mounted on a wall according to one or more examples of the present disclosure.
Figure 11A:
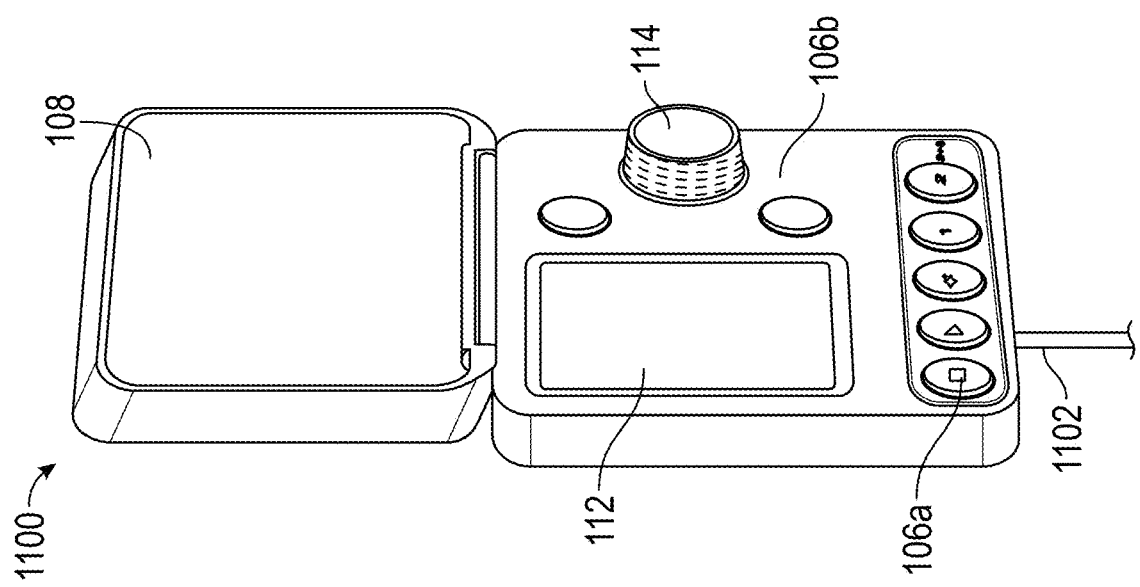

FIGS. 11A-B illustrate two views 1100 and 1101 of a user interface 104 mounted on a wall according to one or more examples of the present disclosure. The view 1100 of FIG. 11A is a perspective view of the user interface 104 mounted on the wall mount 1004 with the interface cover 108 open, and the view 1101 of FIG. 11B is a perspective view of the user interface 104 mounted on the wall mount 1004 with the interface cover 108 closed. As illustrated in FIG. 11A, when the interface cover 108 is open, both the first and second interface regions 106*a,b* are exposed. As mentioned, in some embodiments, the first interface region 106*a* may include the interactive components 110, and the second interface region 106*b* may include the interface dial 114 and other components described above. The user interface 104 of this example may be used, and may perform functions, similarly or identically as described with respect to FIGS. 1A-D. The user interface 104, in this example, is mechanically coupled to the wall mount 1004 for being positioned on the wall, and the user interface 104 may be communicatively coupled to the pump 206, the pump 704, or any other suitable pump for receiving input from the user interface 104 and/or to any other suitable device such as an automation device. In some embodiments, the user interface 104 may be communicatively coupled to the pump and to an automation system via wall wires 1102*a-b* that may be directed from the bottom of the user interface 104, such as from the RS-485 connector 412, to an input of the pump or an output of the automation system.

Figure 13:
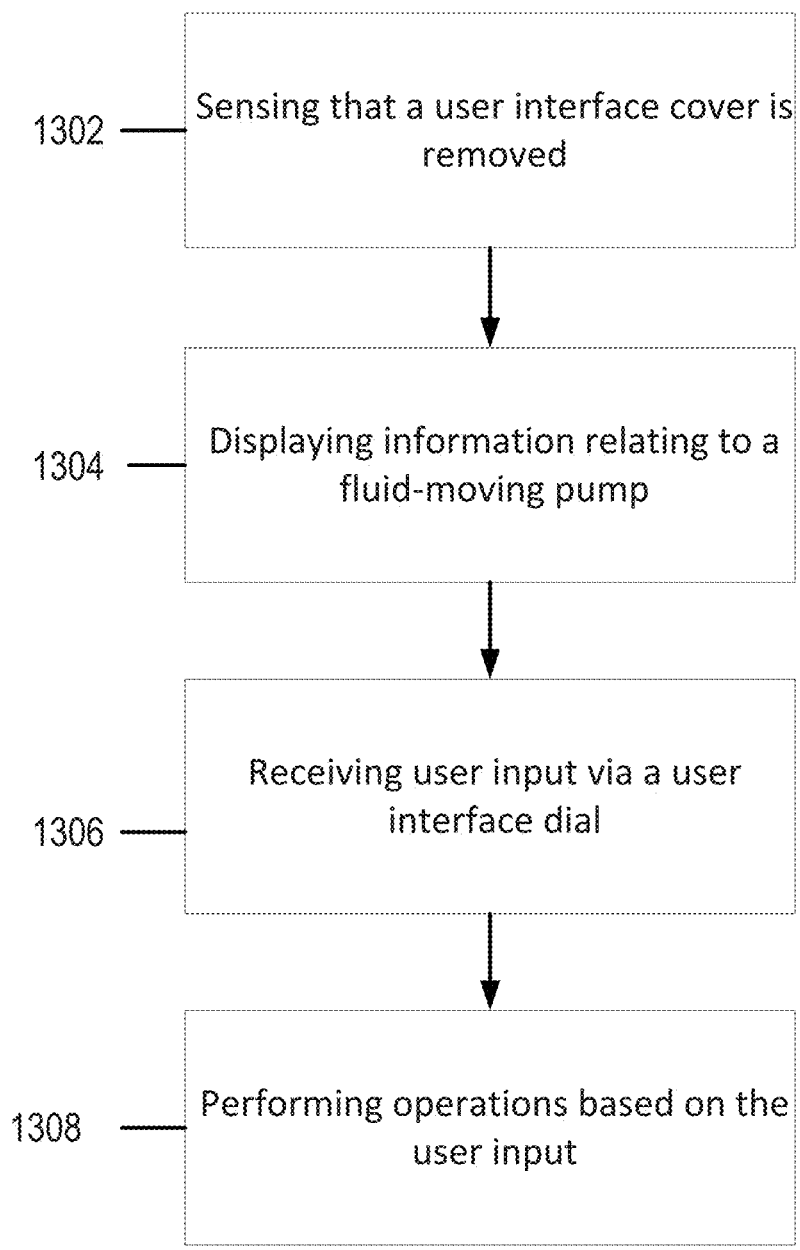
FIG. 13 is a flow chart of an exemplary process for operating a user interface that includes two or more interface regions.

FIG. 13 is a flow chart of a process 1300 for operating a user interface that includes two interface regions according to one or more examples of the present disclosure. At block 1302, the process 1300 involves the user interface 104 detecting that the interface cover 108 is open. A sensor (such as magnet 116) may communicate with the user interface 104 for determining that the interface cover 108 is open.

At block 1304, the process involves the user interface 104 displaying information relating to a pump, such as the pump 206, the pump 704, or any other suitable pump. In response to sensing that the interface cover 108 is open, the user interface 104 may illuminate the screen 112 and display information relating to the pump on the screen 112. The information may include pump settings such as long-term or other settings, pump functions, and the like.

At block 1306, the process involves the user interface 104 of a first of the two interface regions receiving user input via the user interface dial 114 or other interactive component of either the first or second of the two interface regions. The user interface dial 114 may be rotated to change a displayed option and depressed to indicate selection of a displayed option. The user interface dial 114 may be rotated and depressed suitable amounts of time for selecting settings or programs to customize and for adjusting the settings or programs.

At block 1308, the process involves the user interface 104 performing operations in response to the user input from the user interface dial 114 or other interactive component. For example, if the user input from the user interface dial 114 indicates that a long-term program is to be updated and run, the user interface 104 may update the long-term program and may cause the pump to perform operations included in the long-term program.

Exemplary concepts or combinations of features of the present disclosure may include:

- A. A user interface for a fluid-moving pump, the user interface comprising at least two interface regions and a cover for covering one of the at least two interface regions.
- B. The user interface of statement A, wherein the cover is movable between a closed position and an open position, wherein, in the open position, both the first interface region and the second interface region are exposed, and wherein, in the closed position, the second interface region is covered and the first interface region is exposed.
- C. The user interface of statement A or B, wherein the first interface region comprises a first type of interactive component and wherein the second interface region comprises a second type of interactive component different from the first type of interactive component.
- D. The user interface of any of statements A-C, wherein the second type of interactive component comprises at least one of a screen or an interface dial.
- E. A user interface for a fluid-moving pump, in which the user interface is attachable to the fluid-moving pump via a quarter-turn and without the use of tools.
- F. The user interface assembly of statement E, further comprising a mounting cover and an attachment bracket, wherein the user interface is secured to the mounting cover and the attachment bracket without the use of tools.
- G. The user interface of statement E or F, wherein the user interface comprises a first attachment interface, and wherein the attachment bracket comprises a second attachment interface configured to cooperate with the first attachment interface to attach the user interface to the mounting cover and the attachment bracket.
- H. A user interface for a fluid-moving pump, the user interface further comprising at least two RS-485 connections for communicatively coupling the user interface to the fluid-moving pump and to an automation device.
- I. A user interface assembly comprising the user interface of statement H, a mounting cover, and a wire connected to one of the at least two RS-485 connections, wherein the mounting cover comprises a wire region and defines an access port, wherein the wire is at least partially retained in the wire region via a wire clamp and is directed through the access port.
- J. A user interface for a fluid-moving pump, wherein the user interface is configured to be mounted on a wall or a pump and oriented into one of four or more predetermined orientations relative to the wall or the pump.
- K. The user interface of statement J, further comprising a mounting cover configured to attach the user interface on the wall or the pump, and an attachment bracket on the mounting cover, wherein the user interface is attachable to the attachment bracket.
- L. The user interface assembly of statement J or K, wherein the attachment bracket comprises a locking feature, wherein the user interface comprises a plurality of leads, and wherein each predetermined orientation comprises an abutment of the locking feature of the attachment bracket with a particular lead of the plurality of leads.
- M. A user interface for the fluid-moving pump, the user interface further comprising a magnet sensor for sensing whether the cover is open.
- N. A user interface for the fluid-moving pump, the user interface comprising an interface region, a cover for selectively covering the interface region, and a sensor for sensing whether the cover is open.
- O. The user interface of statement N, wherein the sensor is a magnet sensor.
- P. The user interface of statement N or O, wherein the interface region comprises a screen, and wherein the sensor causes the screen to illuminate responsive to sensing that the cover is open.
- Q. The user interface of any of statement N-P, wherein the interface region is a first interface region, and wherein the user interface further comprises a second interface region that is exposed in any position of the cover relative to the first interface region.
- R. A method associated with the user interface comprising sensing that a cover of an interactive region is open, displaying information relating to a fluid-moving pump, receiving user input via a user interface dial, and performing operations based on the received user input.
- S. The method of statement R, wherein receiving the user input comprises receiving a rotation of the user interface dial or receiving a depression of the user interface dial.
- T. A system comprising a fluid-moving pump, a user interface, and a hinge for positioning the user interface on the fluid-moving pump, wherein the hinge is movable between an open position and a closed position to selectively allow access to an interior of the system housing wires connecting the user interface with the fluid-moving pump.

U. The system of statement T, wherein the user interface is mounted on the attachment bracket and oriented into one of four or more predetermined orientations relative to the pump.

V. The system of statement T or U, wherein the attachment bracket comprises a first access port, a second access port, and a hinge, and wherein the second access port is positioned in the hinge.

These example aspects are not intended to be mutually exclusive, exhaustive, or restrictive in any way, and the invention is not limited to these example embodiments but rather encompasses all possible modifications and variations within the scope of any claims ultimately drafted and issued in connection with the invention (and their equivalents). For avoidance of doubt, any combination of features not physically impossible or expressly identified as non-combinable herein may be within the scope of the invention.

Different arrangements of the components depicted in the drawings or described above, as well as components and steps not shown or described, are possible. Similarly, some features and sub-combinations are useful and may be employed without reference to other features and sub-combinations. Embodiments of the invention have been described for illustrative and not restrictive purposes, and alternative embodiments may become apparent to readers of this patent. Accordingly, the present invention is not limited to the embodiments described above or depicted in the drawings, and various embodiments and modifications may be made without departing from the scope of the claims below. Additionally, the phrase "swimming pool" as used herein may include vessels such as spas and hot tubs within its definition.

That which is claimed:

1. A user interface for a fluid-moving pump, the user interface comprising a first interface region, a second interface region, and a cover for selectively covering the second interface region without covering the first interface region, wherein the first interface region comprises a first interactive component, wherein the second interface region comprises a second interactive component different from a type of the first interactive component, and wherein the second interactive component comprises a display.

2. The user interface of claim 1, wherein the cover is movable between a closed position and an open position, wherein, in the open position, both the first interface region and the second interface region are exposed, and wherein, in the closed position, the second interface region is covered and the first interface region is exposed.

3. The user interface of claim 1, wherein the second interface region further comprises an interface dial, and wherein the first interface region comprises at least one of a tangible button or a virtual button.

4. A user interface assembly for a fluid-moving pump, the user interface assembly comprising:
a mounting cover attachable to the fluid-moving pump;
an attachment bracket affixed to the mounting cover; and
a user interface comprising a top side and a bottom side, wherein the top side comprises at least one interactive component, wherein the bottom side comprises an attachment interface, and wherein the attachment interface is configured to engage the attachment bracket via rotation less than 360° and attach the user interface to the attachment bracket without use of tools.

5. A pump assembly comprising:
a motor drive housing; and
a user interface attached to the motor drive housing; and
a first communication connector on the user interface communicatively coupling the user interface with the motor drive housing; and
a second communication connector on the user interface communicatively coupling the user interface to an automation device.

6. The pump assembly of claim 5, wherein the first and second communication connectors are RS-485 connectors.

7. The pump assembly of claim 5, further comprising a mounting cover, and a wire connected to one of the first communication connector or the second communication connector, wherein the mounting cover comprises a wire region and defines an access port, wherein the wire is at least partially retained in the wire region via a wire clamp and is directed through the access port.

8. A method associated with a user interface for a fluid-moving pump, the method comprising:
sensing that a cover of a user interface is open, wherein the user interface comprises a first interface region, a second interface region, and the cover for selectively covering the second interface region without covering the first interface region, wherein the first interface region comprises a first interactive component, wherein the second interface region comprises a second interactive component different from a type of the first interactive component, and wherein the second interactive component comprises a display,
displaying information relating to the fluid-moving pump on the display,
receiving user input via a user interface dial of the second interface region, and
performing operations based on the received user input.

9. The method of claim 8, wherein receiving the user input comprises receiving a rotation of the user interface dial or receiving a depression of the user interface dial.

10. A system comprising a fluid-moving pump, a user interface, and an attachment bracket for positioning the user interface on the fluid-moving pump, wherein the attachment bracket is movable between an open position and a closed position to selectively allow access to an interior of the system housing wires connecting the user interface with the fluid-moving pump, wherein in both the open position and the closed position, the attachment bracket is connected to the fluid-moving pump.

11. The system of claim 10, wherein the user interface is mounted on the attachment bracket and oriented into one of four or more predetermined orientations relative to the fluid-moving pump.

12. A system comprising a fluid-moving pump, a user interface, and an attachment bracket for positioning the user interface on the fluid-moving pump, wherein the attachment bracket is movable between an open position and a closed position to selectively allow access to an interior of the system housing wires connecting the user interface with the fluid-moving pump, wherein the attachment bracket comprises a first access port, a second access port, and a hinge, and wherein the second access port is positioned in the hinge.

* * * * *